United States Patent [19]

Takigawa et al.

[11] Patent Number: 4,481,042
[45] Date of Patent: Nov. 6, 1984

[54] ION IMPLANTATION METHOD

[75] Inventors: Tadahiro Takigawa, Tokyo; Isao Sasaki, Chiba, both of Japan

[73] Assignee: Tokyo Shibaura Denki Kabushiki Kaisha, Kawasaki, Japan

[21] Appl. No.: 448,048

[22] Filed: Dec. 8, 1982

[30] Foreign Application Priority Data

Dec. 18, 1981 [JP] Japan .................................. 56-20515

[51] Int. Cl.$^3$ .......................................... H01L 21/70
[52] U.S. Cl. ...................................... 148/1.5; 29/571; 29/576 B; 250/492.2; 357/91
[58] Field of Search ............... 148/1.5; 29/576 B, 571; 250/492.2; 357/91

[56] References Cited

U.S. PATENT DOCUMENTS

| | | | |
|---|---|---|---|
| 4,063,103 | 12/1977 | Sumi ......................................... | 372/3 |
| 4,254,340 | 3/1981 | Camplan et al. .................. | 250/492.2 |
| 4,283,631 | 8/1981 | Turner ................................. | 376/435 |

OTHER PUBLICATIONS

"Fabrication of lateral doping profiles by a computer-controlled focused ion beam", R. L. Seliger and J. W. Ward, J. Vac. Sci. Technol., vol. 12, No. 6, Nov./Dec. 1975, pp. 1378-1381.

Primary Examiner—Aaron Weisstuch
Attorney, Agent, or Firm—Oblon, Fisher, Spivak, McClelland & Maier

[57] ABSTRACT

An ion implantation method is provided which uses an ion implantation apparatus which is capable of focusing an ion beam into a spot having a diameter smaller than the size of a region into which ions are to be implanted. The ion dose is varied in accordance with the gate region, source and drain regions, and the field region of a semiconductor device including a transistor having short gate length and width.

4 Claims, 17 Drawing Figures

ION IMPLANTATION METHOD

BACKGROUND OF THE INVENTION

The present invention relates to an ion implantation method for use in the manufacture of semiconductor devices and, more particularly, to an improvement in an ion implantation method using a finely focused ion beam or a micro ion beam.

Ion implantation is a very important technique and is widely used in the manufacture of semiconductor devices. For example, in silicon metal oxide semiconductor large scale integration (to be referred to as Si-MOS-LSI), ion implantation is used for controlling the threshold voltage VTH; for formation of well regions, isolation regions, source and drain regions and the like; and for prevention of the punch-through phenomenon.

Figure 1A:
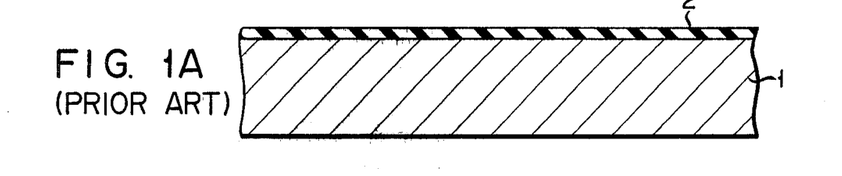
FIGS. 1A to 1I are sectional views showing a conventional Si-MOS-LSI in various manufacturing steps using ion implantation.
Figure 1B:
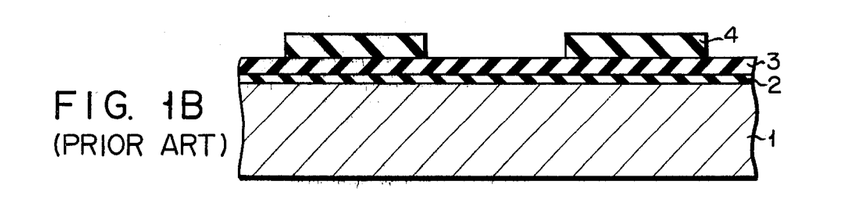
Figure 1C:
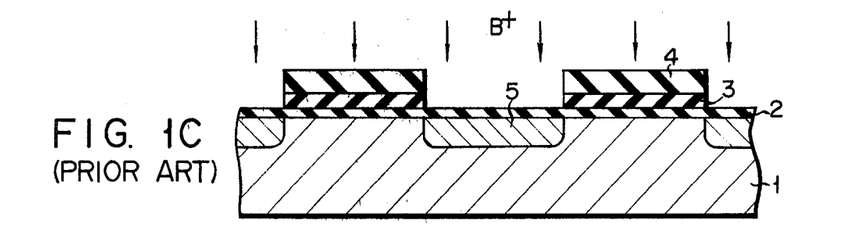
Figure 1D:
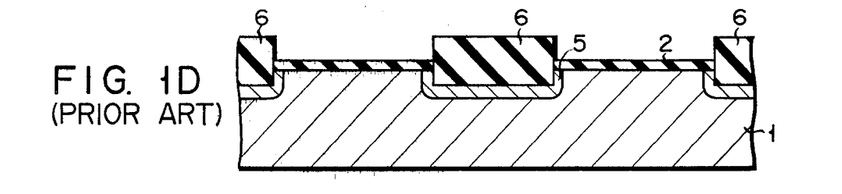
Figure 1E:
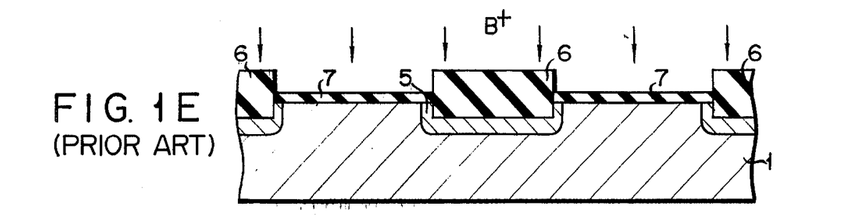
Figure 1F:
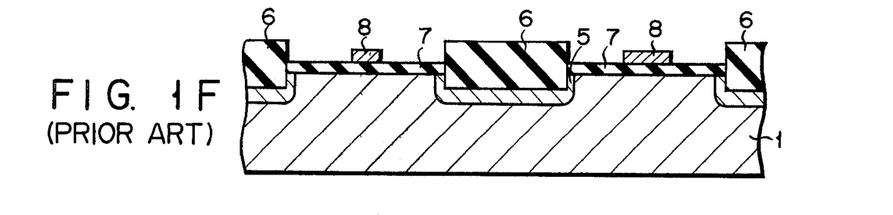
Figure 1G:
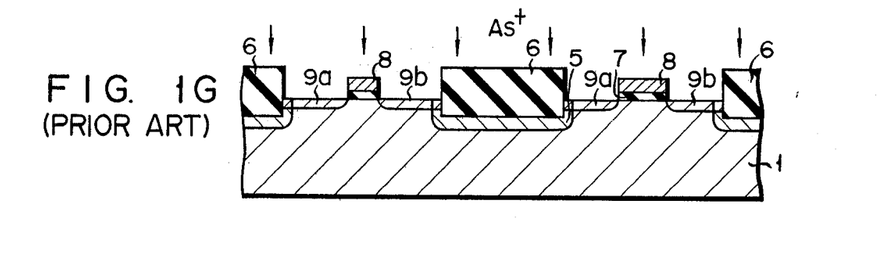
Figure 1H:
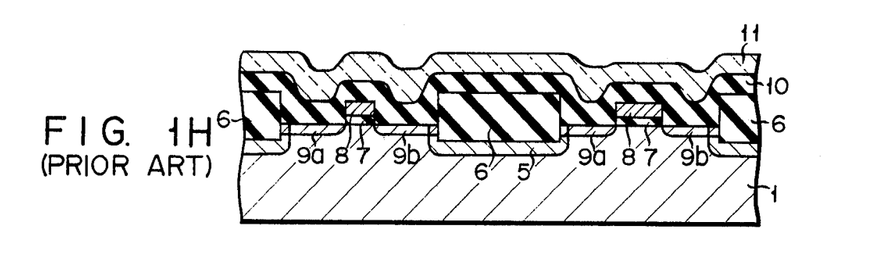
Figure 1I:
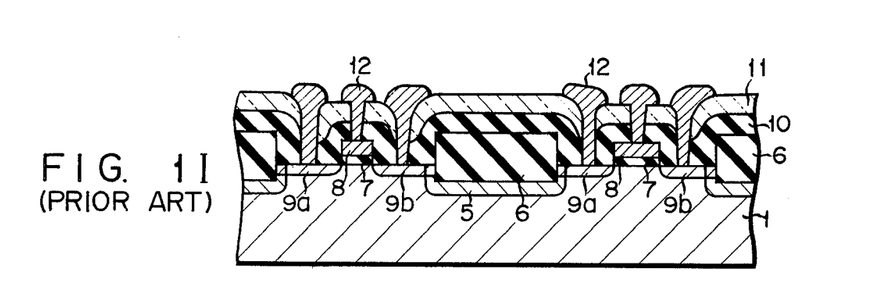

In conventional ion implantation techniques, ions are uniformly implanted into a silicon wafer as will be described hereinafter. FIGS. 1A to 1I are sectional views showing a conventional Si-MOS-LSI during various manufacturing steps using conventional ion implantation techniques. Referring to FIG. 1A first, a silicon wafer 1 is annealed in an oxygen atmosphere at 1,000° C. for 20 minutes to form a silicon oxide ($SiO_2$) film 2 of 500 Å thickness. Next, referring to FIG. 1B, a silicon nitride film 3 is deposited on the silicon oxide film 2 to a thickness of about 4,000 Å. After coating a resist on the silicon nitride ($Si_3N_4$) film 3, it is patterned by general lithography to form resist patterns 4. Then, as shown in FIG. 1C, the silicon nitride film 3 is etched using the resist patterns 4 as a mask. Ion implantation of boron ($B^+$) is performed at an acceleration voltage of 100 keV to form a $p^+$-type layer 5 for element isolation. Referring to FIG. 1D, after removing the resist patterns 4, field oxide films 6 of 1 μm thickness are formed in an oxygen atmosphere at 1,000° C. and the silicon nitride film 3 is removed thereafter. As shown in FIG. 1E, after removing the silicon oxide film 2, a gate oxide film 7 of about 300 Å thickness is formed. Boron ions ($B^+$) are uniformly implanted at an acceleration voltage of 70 keV for the purpose of controlling the threshold voltage VTH. Referring to FIG. 1F, after depositing a polysilicon film of about 3,000 Å thickness over the entire surface of the structure, it is subjected to lithography and etching to form polysilicon gates 8. Subsequently, as shown in FIG. 1G, the gate oxide film 7 is etched to leave only those portions below the polysilicon gates 8. In this state, arsenic ions ($As^+$) are implanted at an acceleration voltage of 100 keV to form source regions 9a and drain regions 9b. Referring to FIG. 1H, after depositing an insulating oxide film ($SiO_2$) 10 of 5000 Å thickness over the entire surface of the structure, a phosphate glass film 11 is deposited on the insulating oxide film 10 to a thickness of 7,000 Å. The phosphate glass film 11 is heated in a nitrogen atmosphere at about 1,000° C. to smoothen its surface. Contact holes are then formed by lithography and etching. After depositing an aluminum film, it is patterned to form aluminum wiring patterns 12. An Si-MOS-LSI as shown in FIG. 1I is finally manufactured.

Figure 2:
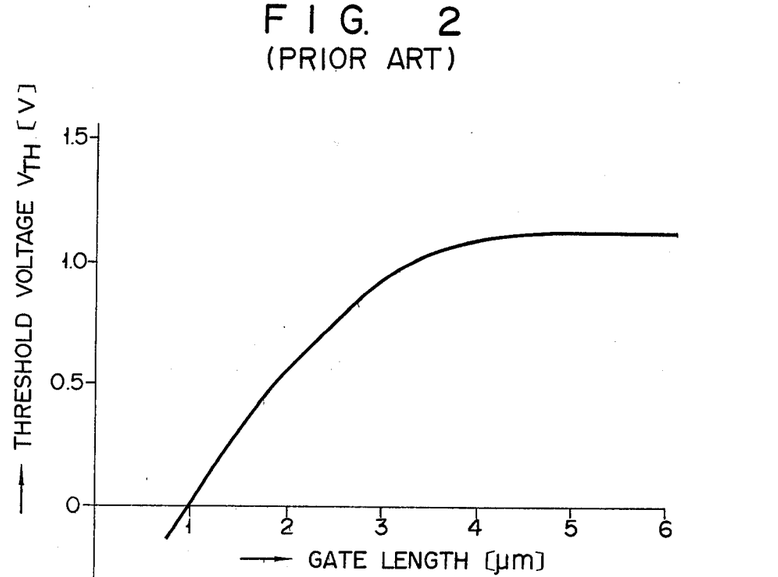
FIG. 2 is a graph showing the threshold voltage VTH as a function of gate length for the MOS transistor manufactured by the steps shown in FIGS. 1A to 1I.
Figure 3:
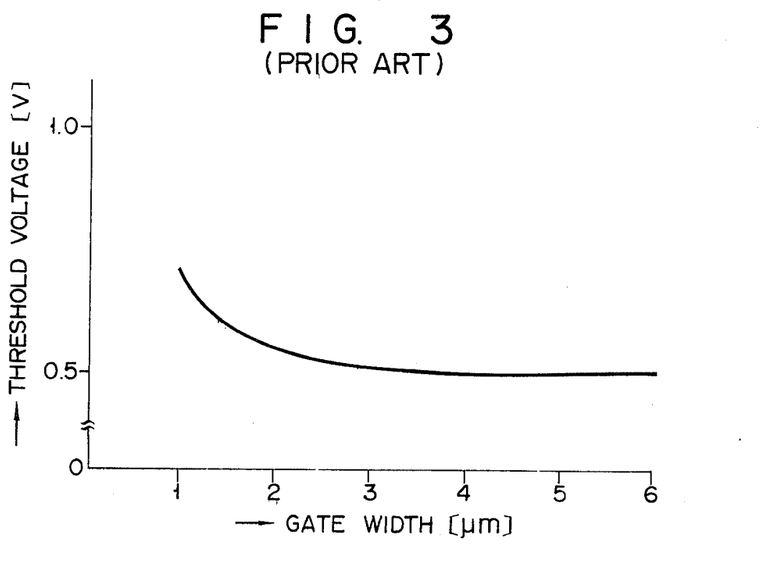
FIG. 3 is a graph showing the threshold voltage VTH as a function of gate width for the MOS transistor manufactured by the steps shown in FIGS. 1A to 1I.

Ion implantation adopted in the manufacture of the Si-MOS-LSI described above is uniform ion implantation in each case. MOS transistors manufactured by such a method have variations in the threshold voltage VTH according to the gate lengths and widths thereof. FIG. 2 is a graph showing the threshold voltage VTH as a function of gate length. FIG. 3 is a graph showing the threshold voltage VTH as a function of gate width. As may be seen from these graphs, with decreases in either the gate length or width of the transistors, or with micronization of the transistors, control of the threshold voltage VTH becomes difficult due to the short channel effect and the narrow channel effect. Furthermore, the problem of the punch-through phenomenon becomes more pronounced with micronization of the transistors.

SUMMARY OF THE INVENTION

It is an object of the present invention to provide an ion implantation method for the manufacture of semiconductor devices, wherein the threshold voltage VTH of a transistor may be easily and precisely controlled, and problems of the short channel effect, the narrow channel effect and the punch-through phenomenon generally encountered with micronization of transistors may be prevented.

A micro ion beam of $B^+$, $P^+$ or $As^+$ of high luminance from a eutectic alloy liquid metal ion source has recently been made available. If such a micro ion beam can be freely deflected and blanked, the ion concentration of an ion-implanted region may be made variable. It is also known that the threshold voltage VTH of a transistor depends upon the gate length and width as well as on the ion concentration of the gate region.

The object of the present invention is accomplished by a method which takes account of the above principles. More specifically, the present invention provides an ion implantation method which uses an ion implantation apparatus comprising an ion gun and an ion optical system for producing an ion beam of a spot diameter smaller than an ion-implanted region to be formed, the apparatus having a deflecting function to scan such an ion beam on a specimen surface and a blanking function to blank the ion beam. According to this method, depending upon whether the gate, source, drain, or field regions of a semiconductor device having transistors of small gate lengths and widths are being implanted, the concentration of ion implantation may be changed.

Since the ion concentration is varied in accordance with the region into which ions are to be implanted according to the present invention, the threshold voltage of the transistor may be easily and precisely controlled. Moreover, the problems of the punch-through phenomenon, the short channel effect and the narrow channel effect usually found in micronized transistors having sizes in the order of submicrons may be prevented. The present invention is extremely useful for the manufacture of various types of semiconductor devices including micronized transistors.

BRIEF DESCRIPTION OF THE DRAWINGS

By way of example and to make the description clearer, reference is made to the accompanying drawings in which.

DETAILED DESCRIPTION OF THE PREFERRED EMBODIMENTS

The preferred embodiment of the present invention will now be described in detail with reference to the accompanying drawings.

Figure 4:
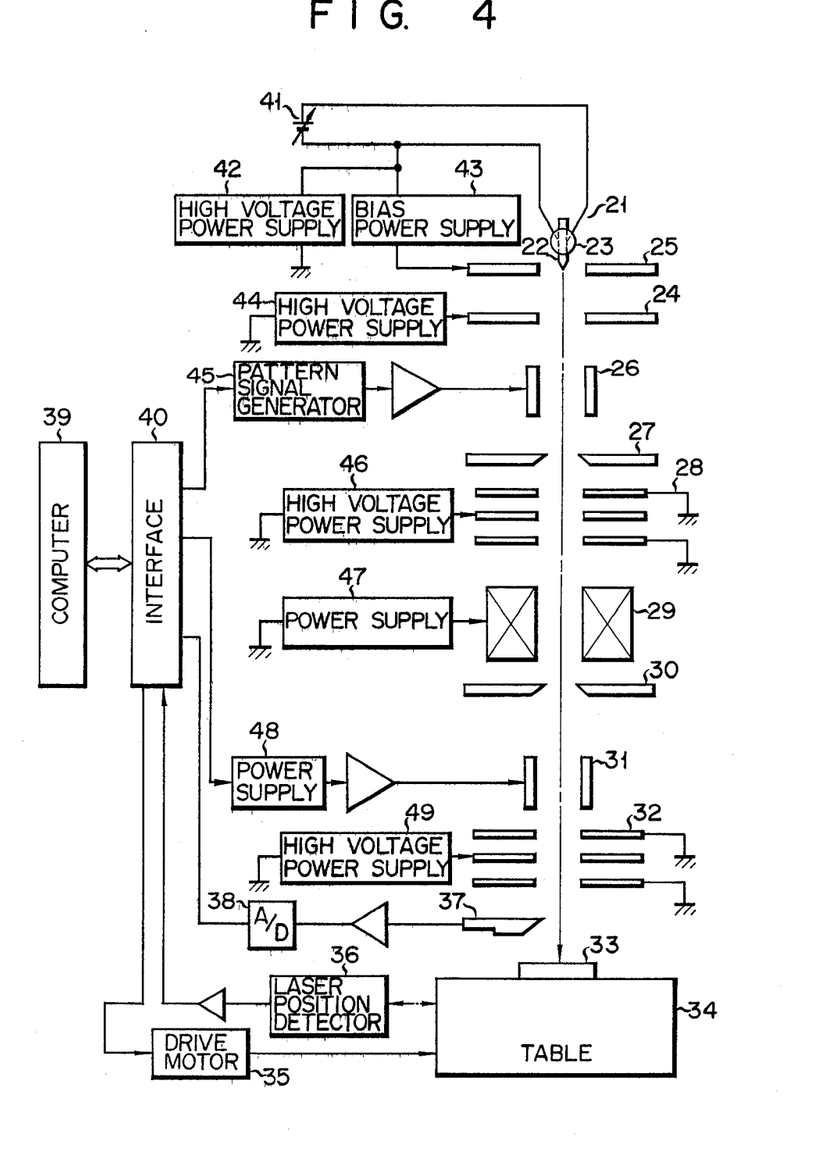
FIG. 4 is a schematic block diagram of a micro ion beam scanner used in accordance with one embodiment of the present invention.

FIG. 4 is a schematic block diagram of a micro ion beam scanner which is used in accordance with one embodiment of the present invention. Referring to FIG. 4, reference numeral 21 denotes a filament for holding and heating a liquid metal; 22, an emitter; 23, a B-Pt-Au-Ge-type liquid metal alloy reservoir; 24, ion deflecting electrodes; and 25, grid electrodes. These parts together form an ion gun for emitting a micro ion beam. Blanking electrodes 26 are for turning the ion beam ON/OFF. A blanking aperture mask 27 is for blanking the ion beam. Electrostatic lenses or condenser lenses 28 of Einzel type serve to focus the ion beam. Reference numeral 29 denotes the deflection coil of a mass analyzer of EXB type. An ion selection aperture mask 30 is for selecting the type of ions to be implanted. A deflector 31 scans the ion beam on a specimen surface. Electrostatic lenses or objective lenses 32 are also of Einzel type. A specimen 33, for example, a silicon wafer, is securely held on a specimen table 34. A drive motor 35 drives the specimen table 34 and a laser position detector 36 detects the position of the specimen table 34. A reflected ion detector 37 is used for registration. An A/D converter 38 converts an analog reflected ion signal from the detector 37 into a digital signal. A computer 39 performs various types of control operations and is connected to an interface 40. A heating power supply 41 is used to supply power to the filament 21. A high voltage power supply 42 is used to supply power to the ion gun. A bias power supply 43 is used to drive the grid electrodes 25. A high voltage power supply 44 is used to drive the ion deflecting electrodes 24. A pattern signal generator 45 converts a pattern signal from the computer 39 into an analog signal. A high voltage power supply 46 is used to supply power to the condenser lenses 28. A power supply 47 is used to produce electric and magnetic fields of the mass analyzer 29. A deflection power supply 48 is used to supply power to the deflector 31. A high voltage power supply 49 is used to supply power to the objective lenses 32.

The micro ion beam scanner of the configuration as described above is similar to that of a known electron beam scanner, for example, as disclosed in U.S. Pat. No. 4,063,103. Ions emitted from the emitter 22 are composite ions containing 32% of B+ ions, for example. The B+ ions alone are selected from the composite ions by the mass analyzer 29 and the ion selection aperture mask 30 and are focused on the specimen 33 by the objective lenses 32. The luminance of the ion gun is $1 \times 10^6$ (A/cm²·str) and is variable within the range of 0.5 to 0.1 μm. An ion dose of $10^{11}$ to $10^{12}$ (ions/cm²) is required for the purpose of controlling the threshold voltage VTH of a transistor. Therefore, in the case of a silicon wafer having a diameter of 4 inches and an ion beam having a spot diameter of 0.5 μm, the ion implantation time is about 5 minutes.

Figure 5:
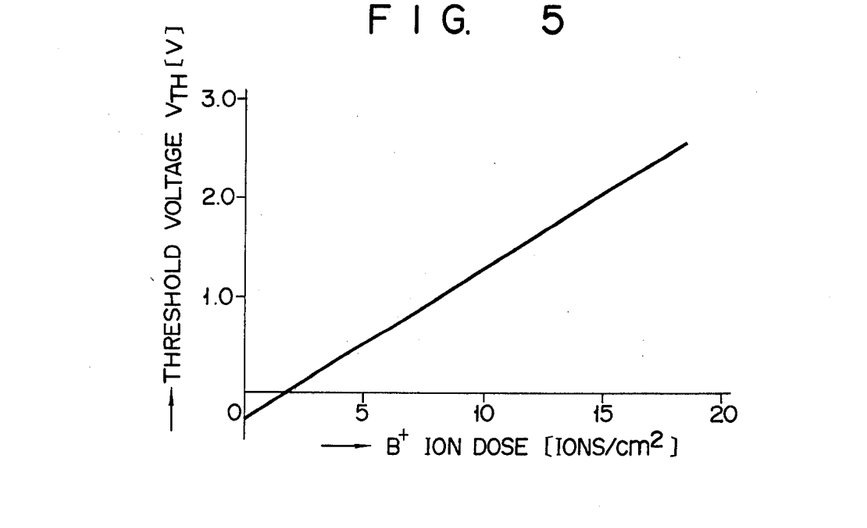
FIG. 5 is a graph showing the threshold voltage VTH as a function of the B+ ion dose for the MOS transistor manufactured by the scanner shown in FIG. 4.
Figure 6:
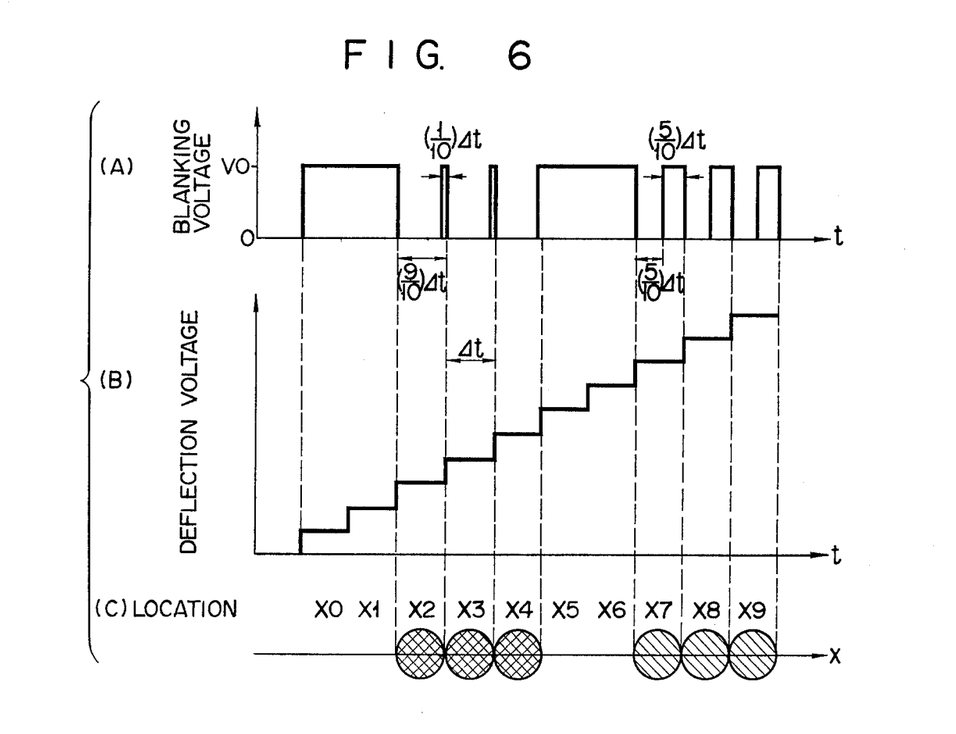
FIGS. 6A to 6C are representations for explaining the process for varying the ion dose according to the embodiment of the present invention.

FIG. 5 is a graph showing the threshold voltage VTH as a function of ion dose; they exhibit a linear relation. As may be seen from FIGS. 2 and 3, the threshold voltage VTH of a MOS transistor with gate length and width being 3 μm or less is expressed by:

$$VTH = F(L, W, D) \ldots \quad (1)$$

where L is the gate length, W is the gate width and D is the ion dose. The threshold voltage VTH may be controlled by storing equation (1) in the computer 39 and varying the ion dose in accordance with the gate dimensions (length and width). The ion dose within a silicon wafer surface may be changed in the following manner. Assume that the ion beam is OFF (blanked) when voltage Vo is applied to the blanking electrodes 26. Assume also that the deflection voltage has a stepped waveform as shown in FIG. 6B so as to scan the ion beam in a stepped form. Let Δt stand for a time period for which the ion beam stays at a given location xn, the pulse width of the blanking voltage or signal being variable in units of (1/10)Δt. When the blanking voltage changes as shown in FIG. 6A, the ion beam is OFF at locations x0, x1, x5 and x6 as shown in FIG. 6C. The ion beam ON time is (9/10)Δt at locations x2, x3 and x4. The ion beam ON time is (5/10)Δt at locations x7, x8 and x9. In this manner, the ion dose may be varied in ten steps at any location.

Figure 7:
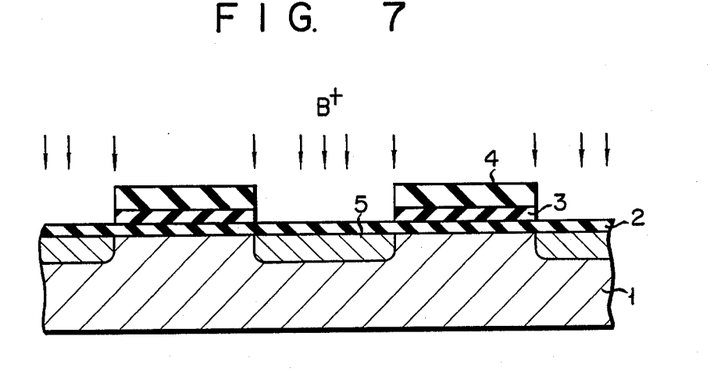
FIGS. 7 to 9 are sectional views for explaining the ion implantation steps according to the embodiment of the present invention.

An example will be described wherein the micro ion beam scanner as described above is used to manufacture an Si-MOS-LSI according to the method of the present invention. First, a micro ion beam scanner as shown in FIG. 4 for implantation of B+ ions and another micro ion beam scanner for implantation of As+ ions are provided; both have variable acceleration voltages. In place of the step of implanting B+ ions as shown in FIG. 1C, B+ ions are implanted only into regions 5 so as to form p+ type field regions, as shown in FIG. 7. Then, the acceleration voltage or the B+ ions is adjusted to 100 keV so as to implant the B+ ions in the regions surrounding the p+-regions 5 at a lower dose than that for the p+-type regions 5, those regions being regions close to prospective source and drain regions (9a and 9b of FIG. 9) and also regions at the boundary between the field and channel regions below the gates. This prevents the narrow channel effect of the transistors, to facilitate micronization thereof.

Figure 8:
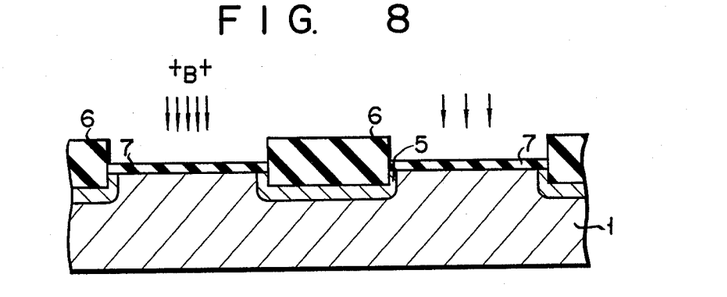

In place of the step of implanting B+ ions shown in FIG. 1E, B+ ions are implanted only into the prospective gate regions, as shown in FIG. 8. The acceleration voltage of B+ ions at this time is controlled to be 70 keV; the ion dose is increased with a decrease in the gate length. With these measures, the threshold voltage VTH can be easily controlled even in the manufacture of a micronized transistor having a gate length of 3 μm or less. Position control of the ion beam with respect to the gate can be performed with high precision by detecting the reflected ions from a mark formed within an LSI chip by the reflected ion detector.

Figure 9:
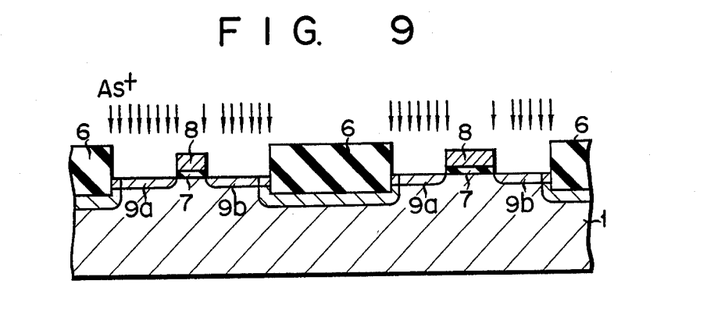

In place of the step of implanting As+ ions shown in FIG. 1G, As+ ions are implanted only into source and drain regions 9a and 9b, as shown in FIG. 9. The acceleration voltage of As+ ions is controlled to be 100 keV. The ion dose in a portion of the drain region 9b near the gate region is controlled to be higher than that in the remaining regions. Thus, the punch-through phenomenon is prevented, to facilitate micronization of the transistors.

In Si-MOS-LSIs manufactured in this manner, even when the gate length and width were 3 μm or less, the threshold voltage VTH was easily controlled to remain at the standard value. High reliability was obtained without causing the narrow channel effect or the punch-through phenomenon.

The present invention is not limited to the particular embodiment described above. For example, the ions to be implanted are not limited to B+ or As+ ions but may include ions of liquid metals such as Si+, Ga+, Se+, or P+ ions which are required in the semiconductor industry. Then, the method of the present invention is not limited to the manufacture of Si-MOS-LSIs but may be extended to various other types of semiconductor devices. The spot of the ion beam need not have a circular shape and may have any appropriate shape as determined by the beam shaping aperture mask. The electron gun used as the ion gun need not be a liquid metal ion gun but may be of any type as long as it has high luminance, for example, it may be of a gas electric field ionization type. This is because if the luminance is about $1 \times 10^3$ (A/cm$^2$·str) or below, the time required for ion implantation becomes enormously long. Various other changes and modifications may be made within the spirit and scope of the present invention.

What we claim is:

1. An ion implantation method which uses an ion implantation apparatus comprising an ion gun and an ion optical system for producing a micro ion beam having a spot diameter which is smaller than the size of a region into which ions are to be implanted, a deflecting device for scanning the ion beam on a surface of a semiconductor wafer, a blanking device for blanking the ion beam, and a control device for controlling said devices, said method comprising the step of implanting the ions into at least one of a gate region, source and drain regions, and a field region of a semiconductor device comprising a transistor being formed on said wafer and having a short gate length and width, said method also comprising the steps of:

determining an ion dose for a predetermined region of said wafer as a function of location thereof and storing the data of said ion dose in said control device; and controlling at least said deflecting device and said blanking device in accordance with said data so as to vary the ON time of the ion beam in accordance with said regions of said semiconductor device, thereby allowing variation of the ion dose.

2. A method according to claim 1, wherein said data is determined so that the ion dose during ion implantation into said gate region is increased with a decrease in the gate length.

3. A method according to claim 1, wherein said data is determined so that the ion dose during ion implantation into said source and drain regions is small at a portion of said drain region close to said gate region.

4. A method according to claim 1, wherein said data is determined so that the ion dose at a portion of said field region close to said source and drain regions and at a boundary between said field region and said channel region below said gate region is small.

* * * * *

UNITED STATES PATENT AND TRADEMARK OFFICE
CERTIFICATE OF CORRECTION

PATENT NO. : 4,481,042
DATED : November 6, 1984
INVENTOR(S) : Takigawa et al.

It is certified that error appears in the above-identified patent and that said Letters Patent is hereby corrected as shown below:

Title page:

Foreign Application Priority Data should be:

- -[30] Dec. 18, 1981  JAPAN.........56-205015 - -

Signed and Sealed this

Nineteenth Day of March 1985

[SEAL]

Attest:

DONALD J. QUIGG

Attesting Officer     Acting Commissioner of Patents and Trademarks